United States Patent [19]

Greeneich

[11] 4,264,711

[45] Apr. 28, 1981

[54] METHOD OF COMPENSATING FOR PROXIMITY EFFECTS IN ELECTRON-BEAM LITHOGRAPHY

[75] Inventor: James S. Greeneich, San Marcos, Calif.

[73] Assignee: Burroughs Corporation, Detroit, Mich.

[21] Appl. No.: 101,828

[22] Filed: Dec. 10, 1979

[51] Int. Cl.$^3$ .............................................. G03C 5/00
[52] U.S. Cl. ................................... 430/296; 430/942
[58] Field of Search ............................ 430/296, 942; 250/492 B; 427/43

[56] References Cited

U.S. PATENT DOCUMENTS

| | | | |
|---|---|---|---|
| 3,681,103 | 8/1972 | Brown | 430/296 |
| 3,971,860 | 7/1976 | Broers et al. | 430/296 |

OTHER PUBLICATIONS

H. Sewell, *Journal Vacuum Science and Technology*, vol. 15, No. 3, pp. 927-930, May/Jun. 1978.
M. Parikh, *Journal Vacuum Science and Technology*, vol. 15, No. 3, pp. 931-933, May/Jun. 1978.

*Primary Examiner*—Won H. Louie, Jr.
*Attorney, Agent, or Firm*—Charles J. Fassbender; Kevin R. Peterson

[57] ABSTRACT

In the process of constructing microelectronic circuits on a semiconductor chip, electron-beam lithography is utilized to fabricate high resolution resist patterns. The resolution however, is limited by proximity effects which are due to scattering of the electron-beam as it passes through the resist. In the disclosed method, those proximity effects are compensated for by making the energy that is absorbed by the resist from the electrons, substantially greater at the perimeter of each shape in the pattern than at the interior of those shapes.

17 Claims, 10 Drawing Figures

Fig. 4

Equations

1. $\varepsilon_T(r, z_o) = \varepsilon_{FR}(r, z_o) + \varepsilon_{BR}(r, z_o) + \varepsilon_{BS}(r, z_o)$ 2. $\varepsilon_{FR}(r, z_o) = F(r, z_o) \, \xi(s)$ 3. $\xi(s) = -\dfrac{dE(s)}{ds} = 2\pi N_o e^4 \rho \dfrac{\bar{Z}}{A} \dfrac{1}{E(s)} \ln\left[\dfrac{aE(s)}{I}\right]$ 4. $F(r, z_o) = \dfrac{f(\Theta)}{2\pi R_P^2} \sqrt{\dfrac{\Theta_P}{\sin \Theta_P}}$, $\Theta_P = \tan^{-1}\left(\dfrac{r}{Z_o - Z_P}\right)$ 5. $f(\Theta) = \dfrac{1}{\Theta_o^2} \int_o^\infty \text{EXP}\left\{\dfrac{2P_e}{\bar{Z}}\left[\dfrac{\bar{Z}+1}{2}(yk_1(y)-1) + 2L(y)\right]\right\} J_o(xy) y \, dy$ ; $x = \dfrac{\Theta}{\Theta_o}$ 6. $L(y) = -\dfrac{1}{2} y k_1(y) - k_o(y) - \ln(y) + \dfrac{1}{2} - \ln\left(\dfrac{b}{2}\right)$, $\Theta_o = \dfrac{\lambda Z^{1/3}}{2\pi a_H}$ 7. $\varepsilon_{BR}(r, z_o) = \dfrac{0.045 \, \bar{Z} n(\alpha)}{\pi R_B} \cdot \int_{z_o}^{z_{max}} dz \left[\dfrac{E(z)}{E_o}\right]^{(2c-2)} \dfrac{\xi(s)}{(R_r + z - z_o)^2}$ 8. $\varepsilon_{BS}(r, z_o) = \dfrac{0.045 \, \bar{Z}_s}{\pi R_{BS}} \int_o^{z_{smax}} dz_s \left[\dfrac{E_s(z_s)}{E_{r-s}}\right]^{(2c_s-2)} \dfrac{\xi_r(s, E_{s-r})}{(R_s + z_s + T - z_o)^2}$ 9. $e_T(r, z_o) = \sum^{pattern} \varepsilon_T(r, z_o) \ast \text{beam shape}$ 10. $M_f(r, z_o) = \dfrac{Mn}{1 + \dfrac{g \, e_T(r, z_o) Mn}{\rho A_o}}$ 11. $R(r, z_o) = R_o + \dfrac{\beta}{M_f(r, z_o)^\alpha}$

METHOD OF COMPENSATING FOR PROXIMITY EFFECTS IN ELECTRON-BEAM LITHOGRAPHY

BACKGROUND OF THE INVENTION

This invention relates to methods of fabricating integrated microelectronic circuits; and more particularly to, methods of compensating for proximity effects which occur when a layer of electron sensitive resist is patterned with a scanning electron beam. During the fabrication of the above mentioned microelectronic circuits, it is common practice to cover a layer of some material which is to be patterned (such as an insulating layer of silicon dioxide, or a conductive layer of metal) with a layer of electron sensitive resist. Subsequently, various portions of the resist which correspond to the pattern that is to be formed on the underlying material are bombarded with a scanning electron beam. This changes the solubility of the resist in the bombarded regions. Consequently, either the bombarded portions of the resist or the unbombarded portions may be selectively removed by exposing the resist to a suitable etchant. Those portions of the resist which thereafter remain are then used as a mask for patterning the underlying material.

One limitation however to the above technique is caused by electron scattering. As used herein electron scattering refers to the fact that as the electron beam passes through the resist, some of those electrons collide with the molecules of the resist and are thereby scattered in various directions. Thus, the amount of energy which a particular point in the resist receives is not simply a function of the energy of the overlying electron beam; but it is also a function of the energy and all of the electron beams which are in close proximity to that point. This is a problem because all of the points in the resist portions that are bombarded do not receive the same number of scattered electrons. Consequently, the solubility of the bombarded resist portions varies from one point to another, and this limits the fidelity with which the resist can be patterned.

In the past, one technique for dealing with this problem has been to modify the shape of the portions of the resist that are bombarded with electrons from those shapes which are actually desired. For example, if it is desired to shape the resist into a long narrow line that is only 0.5 micrometers wide, then this might be achieved by bombarding two portions of resist that are spaced apart by 0.70 micrometers, as opposed to 0.50 micrometers. Conversely, if it were desired to form a long narrow gap of 0.5 micrometers width in the resist, then this might be achieved by bombarding a long narrow portion of the resist which is only 0.3 micrometers wide as opposed to 0.5 micrometers wide. In each case, the exact amount by which the bombarded shape must be modified to achieve the desired shape depends upon not only the shape of the particular resist portion but also upon the resist thickness, the beam energy, and the proximity of each resist portion to all of the other portions that are being bombarded.

Another technique which has been used in the prior art to compensate for electron scattering has been to keep the shape of each portion of the resist which is bombarded the same as the shape that is desired, but to vary the dosage of electrons which each particular shape in the pattern receives. That is, one portion of the resist receives a uniform dosage $D_1$; another portion of the resist receives a uniform dosage $D_2$; etc. But this technique is also undesirable because the dosage of electrons for any particular region depends upon the shape of that region, the proximity of that region to other regions which are being bombarded, the resist thickness, and the beam energy. And since typical microelectronic circuit patterns contain many thousands of shapes in millions of combinations with each other, correction by this technique is extremely complicated and can be achieved only through large amounts of computer calculation and experimental optimization.

Therefore, it is a primary object of this invention to provide an improved method of compensating for proximity effects which occur in electron beam lithography.

Still another object of the invention is to provide a method of compensating for proximity effects which is simple, is valid for all pattern shapes and combinations, works for a large variety of process conditions, and does not require any complex computer calculations.

BRIEF SUMMARY OF THE INVENTION

These and other objects are accomplished in accordance with the invention by a method wherein each particular shape in the resist pattern is bombarded with electrons such that the energy absorbed by the resist from the electrons is substantially greater at the perimeter of those shapes than at the interior. Preferably, the absorbed energy at the perimeter is at least $1\frac{1}{2}$ times the absorbed energy at the perimeter. This may be achieved by serially scanning the various shapes in the resist pattern with electron-beam of essentially constant intensity; and exposing the perimeter of those shapes to the electron-beam for a substantially greater time duration than the interior.

Alternatively, the method may be carried out by serially scanning each of the shapes at a uniform rate with an electron-beam of selectable intensity; and by making the intensity of the beam of the perimeter of those shapes substantially greater than the intensity at the interior. As another alternative, the method may be carried out by serially scanning each of the shapes at a uniform rate with an electron-beam of essentially constant intensity; and by subsequently performing an additional scan of only the perimeter of each shape.

As still another alternative, the method may be carried out by simultaneously bombarding all of the shapes in the resist pattern with electrons that are emitted from a mask which is constructed to make the electron density at the perimeter of each shape in the pattern substantially greater than the electron density at the interior.

BRIEF DESCRIPTION OF THE DRAWINGS

Various features and advantages of the invention will best be understood by reference to the following detailed description and accompanying drawings wherein:

FIG. 4 is a set of equations which describe the details of the proximity problem.

DETAILED DESCRIPTION

Figure 1:
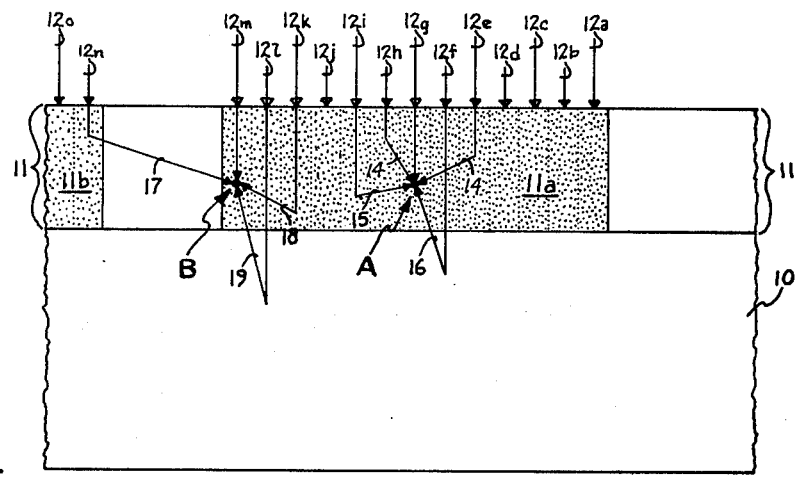
FIG. 1 is a greatly enlarged cross-sectional view of a substrate with a layer of resist lying thereon that schematically illustrates the proximity effect problem.

Reference should now be made to FIG. 1 where there is illustrated a greatly enlarged cross-sectional view of a semiconductor substrate 10 having a layer of electron sensitive resist 11 disposed thereon. Typically, substrate 10 is approximately 10–20 mils thick, whereas the electron sensitive resist 11 is only approximately one-half micron thick. The resist 11 may be either of the positive or negative type. An example of the former is poly methyl/methacrylate (PMM), and an example of the latter is poly styrene.

In the present invention, selected portions 11a and 11b of the resist layer 11 are bombarded by a high energy scanning electron beam. This electron beam is illustrated at its various positions during the scanning process by reference numerals 12a, 12b, . . . 12o. The beam itself has a circular cross-section, and the electron density within the beam has a Gaussian distribution. Typically, the peak electron density (which occurs at the center of the beam) is reduced by a factor of two at a distance of 1/16 micron from the beam's center; and the distance by which the center of the beam is moved from one position to the next is $\frac{1}{8}$ micron.

By bombarding the resist portions 11a and 11b with electrons, the solubility of the resist in those portions is made different than the solubility of the resist that is not bombarded. In particular, a positive resist becomes more soluble by bombarding it with electrons; whereas a negative resist becomes less soluble. Also, the degree by which the solubility changes depends upon several factors, such as the number of electrons and their energy as they pass through the resist. In the present invention, this degree of solubility is controlled so as to reduce proximity effects and thereby improve the fidelity of the resist pattern.

To further explain what is herein meant by proximity effects, it is helpful to compare in a simplified fashion, the energy which two points "A" and "B" in the resist portion 11a receive from the scanning electron beam. Point "A" is in the interior of the resist portion, wheras point "B" is at the perimeter. These points are illustrated in both FIG. 1 and FIG. 2. Also in FIG. 2, each of the squares 13 represent one of the positions of the electron beam as it scans the resist portions.

A large percentage of the energy which point "A" receives is contributed by the electron beam 12g, which lies directly over point "A". However, point "A" also receives significant amounts of energy from all of the electron beams that are in close proximity to beam 12g. This is because some of the electrons in those beams are scattered by the molecules in resist layer 11 and substrate 10 such that they pass through point "A", and also because some of the electrons in the adjacent beams pass directly through point "A" due to the beam's Gaussian distribution.

In FIG. 1, the electrons that are forward scattered in the resist and pass through point "A" are indicated schematically by reference numeral 14. Also, those electrons which are back scattered in the resist and pass through point "A" are indicated by reference numeral 15; and those electrons which are back scattered in the substrate and pass through point "A" are indicated by reference numeral 16. Further in FIG. 2, the relative contribution of the beams (due to these scattered electrons) to the energy which is absorbed by the resist at point "A" is indicated in a very simplified manner by reference numerals A1–A5. There, reference numeral A1 implies that the beam in that position is the most significant contributor, reference numeral A2 implies that the beam in that position is the next most significant contributor, etc.

Similarly, a major portion of the energy that is received by point "B" in the resist layer 11 is contributed by the electron beam 12m, which lies directly over that point. However, point "B" also receives substantial amounts of energy from the electron beams that are in close proximity to beam 12m. Reference numerals 17, 18, and 19 respectively indicate electrons that pass through point "B" due to forward scattering in the resist layer, back scattering in the resist layer, and back scattering in the substrate. Note that point "B", which is in resist portion 11a, also receives some energy from the electron beams that scan the adjacent resist portion 11b. This is because in typical patterns, adjacent resist portions such as 11a and 11b are separated by extremely small distances, such as only 0.5 micrometers. Thus, the proximity effect problem has both an intra-pattern aspect and a inter-pattern aspect.

Figure 2:
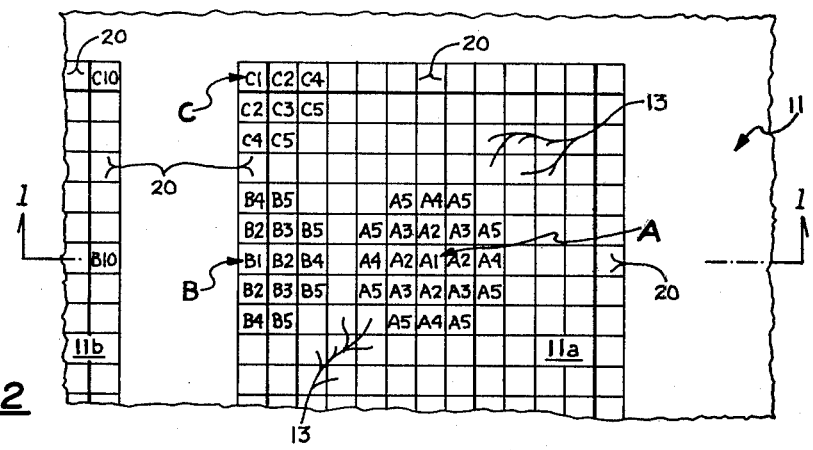
FIG. 2 is a plan view of the resist layer in FIG. 1.

In FIG. 2, the relative contribution to the energy that is received at point "B" from the nearby electron beams is indicated by reference numerals B1–B10. There, B1 indicates the largest contributor to the energy received at point "B", B2 indicates the next largest contributor, etc. Similarly, reference numerals C1–C10 in FIG. 2 indicate the relative amounts of energy that are received at a point "C" which lies in the corner of resist portion 11a.

By inspection of FIG. 2, it can be seen that the intra and inter proximity effects around point "C" will be different than those around point "B", and that the intra and inter proximity effects around point "B" will be different than those around point "A". In the prior art, these differences have resulted in a degradation of the fidelity of the resist pattern. By in the present invention, these proximity effects are compensated for and thus pattern fidelity is greatly improved.

Basically, this is achieved by bombarding the resist portions 11a and 11b with electrons such that the energy absorbed at the perimeter of those portions is substantially greater than the energy absorbed at the interior. This may be achieved by holding the intensity of the electron beam constant as it scans the resist portions 11a and 11b while exposing the perimeter of those portions to the electron beam for a substantially greater time duration than the interior. Alternatively, the resist portions 11a and 11b may be scanned at a constant rate with an electron beam of a selectable intensity, and the intensity is made substantially greater at the perimeter than at the interior. The extent to which this improves pattern fidelity will now be made evident by the following analysis.

Figure 3:
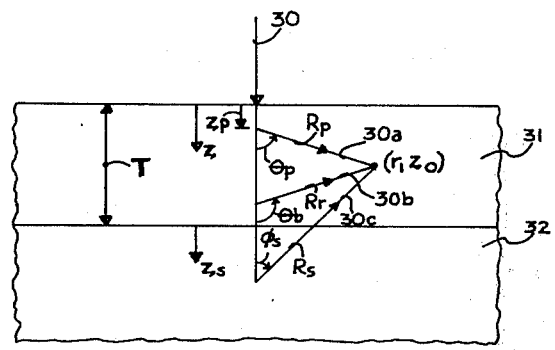
FIG. 3 is a schematic diagram illustrating various geometrical parameters that are relevent to a detailed analysis of the proximity problem.

To begin the analysis, reference should now be made to FIG. 3. There, reference numeral 30 indicates an electron beam having a delta function shape, and which bombards a layer of electron sensitive resist 31 that overlies another substance 32. The substance 32 may be a substrate, an insulating layer of silicon dioxide, a metallic conductive layer, or a layer of any other material which is to be patterned with the resist serving as a mask. Consider now the energy per unit volume that is absorbed by the resist 31 at a point whose coordinates are r,$z_0$. That energy is a function of the electrons which are forward scattered along path 30a in the resist 31 through the point r,$z_0$ plus the electrons which are back scattered along path 30b in the resist 31 through the point r,$z_0$ plus the electrons which are back scattered along a path 30c from the underlying material 32 through the point r,$z_0$.

The above statement is expressed mathematically by equation 1 in FIG. 4. There, the term $\epsilon_T(r,z_0)$ represents the total energy per unit volume that is absorbed by the resist at the point r,$z_0$; and the terms $\epsilon_{FR}(r,z_0)$, $\epsilon_{BR}(r,z_0)$, and $\epsilon_{BS}(r,z_0)$ respectively represent those portions of the total energy which are contributed by the scattered electrons along paths 30a, 30b, and 30c.

Consider next the term $\epsilon_{FR}(r,z_0)$ of equation 1 which may be expanded as illustrated in equation 2. There, the term $F(r,z_0)$ represents that fractional portion of the electrons in beam 30 per unit area which are forward scattered in the resist 31 through the point r,$z_0$; and the term $\epsilon(s)$ represents the spacial rate at which energy is absorbed by the resist from the electrons after they have passed a distance s to reach the point r,$z_0$. This spacial rate of energy transfer from the electrons to the resist can be expressed in expanded form as given by equation 3.

In that equation, $N_0$ is Avogadro's number; e is the charge of an electron; $\rho$ is the density of the material through which the electron is traveling; $\bar{Z}$ and $\bar{A}$ respectively are the average atomic number and gram atomic weight of the material through which the electron is traveling; E(s) is the energy of the electron after it has travelled a distance s in the material; and I is the mean exitation energy for the electron energy loss in the material. Values for I may be experimentally obtained and are dependent upon the particular material through which the electron is traveling. For example, I equals 65.6 eV for the positive electron sensitive resist of PMM.

Similarly, the term $F(r,z_0)$ may be expanded into its component parts as given by equation 4. There, the terms $R_p$, $\phi_p$, r,$Z_0$ and $z_p$ are defined as illustrated in FIG. 3; and the term $f(\theta)$ is defined by equations 5 and 6. In those equations, $p_e$ is the average number of elastic scattering events to which electron is subjected in passing through a layer of a material of thickness T; $K_0$ is a modified Hankel function of order 0; $K_1$ is a modified Hankel function of order 1; $J_0$ is a Bessel function of order 0; ln(b) is Euler's constant; $\lambda$ is the electron wavelength; and $a_H$ is the Bohr radius.

Similarly, the terms $\epsilon_{BR}(r,z_0)$ and $\epsilon_{BS}(r,z_0)$ in equation 1 may also be expanded in terms of various physical parameters. These expanded expressions are given by the equations 7 and 8. In equation, 7, n(0) is the number of electrons arriving at the plane z=0; $R_B$ is a characteristic distance for energy loss in solids; it is the electron path length where the energy has gone to 0; E(z) is the energy of one electron after it has penetrated the resist to a depth of z; $E_0$ is the energy of one electron as it hits the plane z=0; and c equals 0.045 $\bar{Z}$.

In equation 8, all of the terms are similarly defined with the subscript "s" referring to the substrate medium. Thus for example, the term $\bar{Z}_s$ is the average atomic number of the material in layer 32; $R_{BS}$ is the characteristic distance for energy loss in material 32 for the electron path length where the energy goes to 0; $E_{r-s}$ is the energy of one electron as it enters material 32; $z_{s\,max}$ is the maximum depth to which an electron can penetrate into material 32 and have sufficient energy to back scatter to the point r,$z_0$.

By substituting equations 2-8 into equation 1, an expression is obtained for the absorbed energy per unit volume in the resist at point r,$z_0$ that occurs in response to only a single delta function shaped electron beam. Thus, the effect of the beam's shape and the resist patterns which are to be bombarded still must be taken into account. To that end, equation 1 is convolved with the beam shape, and the result is superimposed with those portions of the resist that are exposed to the beam. This is expressed mathmatically by equation 9. In that equation, $l_T(r,z_0)$ represents the total energy that is absorbed per unit volume by the resist at the point r,$z_0$ after the electron beam bombarding step is complete; and ✶ represents the convolution operation.

Next, utilizing equation 9, the local solubility rate of the resist at the point r,$z_0$ may be obtained. This is done by substituting equation 9 into equations 10 and 11. Equation 10 gives the fragmented molecular weight $M_f$ throughout the resist as a function of the absorbed energy density $e_T(r,z_0)$; and equation 11 gives the empirical relationship between resist solubility rate $R(r,z_0)$ throughout the resist as a function of the fragmented molecular weight. In those equations; $M_n$ is the average molecular weight of the original resist; g is the number of scission events per electron volt of absorbed energy; Ro, beta and alpha are measured parameters dependent upon the strength of the developer. Ro is the background solubility rate—is characterizes the removal of very high molecular weight materials such as non-irradiated regions. Beta is a proportionality constant. The parameter alpha describes the contrast of the resist in the chosen developer.

To determine the significance of the disclosed method, equations 9 through 11 have been solved by a computer and plotted for a wide variety of resist exposure patterns. Those results have also been verified by experiments in the laboratory. Two resist patterns, which represent a type of worst case condition, are the half micron gap and the half micron line. In the half micron gap pattern, two large portions of the resist are bombarded and they are separated by only a half micron gap which is not bombarded. In the half micron line pattern, only a long narrow portion of the resist which is one-half micron wide is bombarded by the scanning electron beam.

Figure 5A:
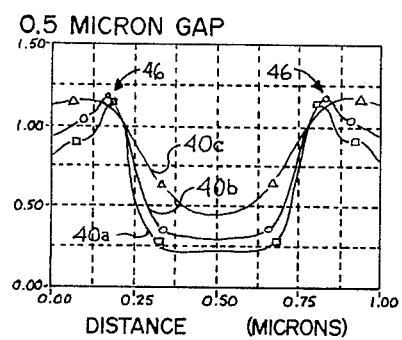
FIGS. 5a–5d are a set of curves illustrating results which are obtained with the disclosed method.
Figure 5B:
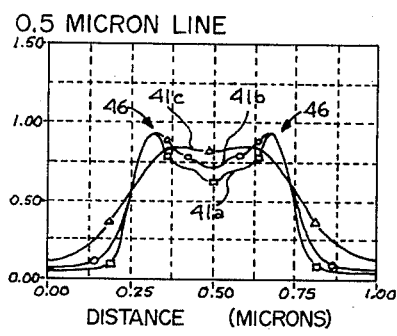

FIGS. 5a and 5b respectively show the normalized absorbed energy density (i.e. equation 9) for the half micron gap pattern and the half micron line pattern when the perimeter of those patterns is bombarded by an electron beam for a greater time interval than the interior portion of those patterns. In particular, the exposure time for the perimeter of the resist patterns was 1.5 times the exposure time for the interior of those patterns. Also, the intensity of the electron beam was held constant, and the energy level of the electrons as they hit the resist was set at 20 keV.

Figure 6A:
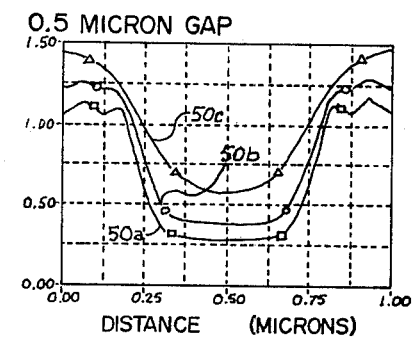
FIGS. 6a–6d are a set of curves illustrating for comparison purposes, results which are obtained when the disclosed method is not used.
Figure 6B:
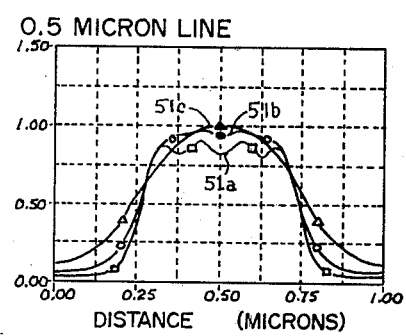

In comparison, FIGS. 6a and 6b respectively are plots of the normalized absorbed energy density for the half micron gap pattern and the half micron line pattern where the perimeter of those patterns received no extra dosage of electrons. That is, in FIGS. 6a and 6b, the exposure time and intensity of the electron beam at the perimeter was the same as at the interior. Again, the energy level of the electrons as they hit the resist was set at 20 keV.

Also, FIGS. 5a, 5b, 6a, and 6b, were all derived using a electron sensitive resist layer whose thickness was one-half micron. The normalized energy density at the top of that resist layer are given by curves 40a, 41a, 50a, and 51a. The normalized energy density at the center of the resist (i.e. at a depth of 0.25 microns) is given by curves 40b, 41b, 50b, and 51b. And the normalized energy density at the interface of the resist and the underlying substance is given by curves 40c, 41c, 50c, and 51c.

By inspection of FIGS. 5a and 5b, it can be seen that the energy absorbed at the perimeter of the corresponding resist patterns is substantially greater than the energy absorbed at the interior or those patterns. Note for example, the sharp peaks 46 in curves 40a, 40b, 41a, and 41b. Basically, these peaks of absorbed energy density operate to sharply define the edge of the resist pattern and thereby improve pattern fidelity after the resist is exposed to a selective etchant. No such energy peaks occur in the FIGS. 6a and 6b curves. There, all of the curves have a smoothly rounded shape at the perimeter of the resist patterns; and this is detrimental to good pattern fidelity.

As further evidence of how the above energy peaks improve the pattern fidelity, consider now the curves of FIGS. 5c, 5d, 6c, and 6d. These curves show how the resist is dissolved as a function of time when it is exposed to a selective etchant. FIGS. 5c, 5d, 6c, and 6d respectively are derived from the curves of FIGS. 5a, 5b, 6a, and 6b. This is achieved by calculating the local solubility rate of the resist as has been previously been described via equation 11, and by taking the time intergal of that equation.

Figure 5C:
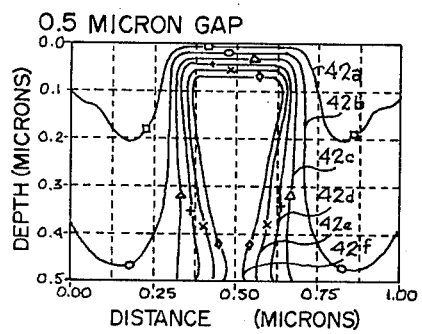

In FIG. 5c, curves 42a–42f illustrate the shape of the resist at 30 second intervals as it is exposed to the etchant. That is, curve 42a shows the shape of the resist after it is in the etchant for 30 seconds, curve 42b shows the shape of the resist after it is in the etchant for 60 seconds, etc. Similarly, in FIG. 5d, curves 43a–43f show the shape of the resist at 30 second intervals; in FIG. 6c, curves 42a–42e show the shape of the resist at 30 second intervals; and in FIG. 6d, curves 53a–53f show the shape of the resist at 30 second intervals.

In those plots, the etchant concentration has been adjusted for the purpose of comparison, such that the half micron line patterns develop perfectly after 120 seconds. This may be seen by inspection of curves 43d and 53d. It is, of course, a simple matter to either increase or decrease the etchant's concentration to achieve this result; however, perfectly developing one pattern will always be detrimental to the development of all of the other patterns, such as the half micron gap.

Figure 6C:
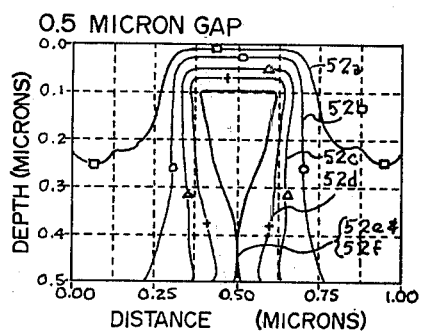
Figure 5D:
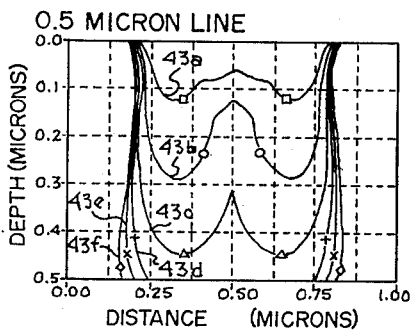
Figure 6D:
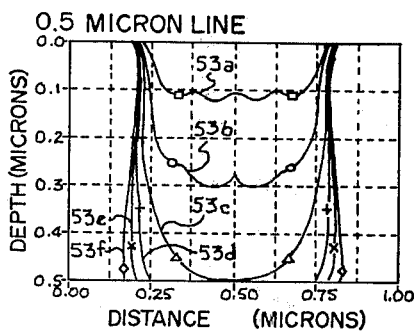

Thus, a form of worst case test for the disclosed method is to observe the shape of the resist in the half micron gap patterns of FIG. 5c and FIG. 6c after 120 seconds have elapsed, and compare the results. Those shapes are given by curves 42d and 52d. Inspection of curve 42d shows that the thickness of the undissolved resist after 120 seconds is just slightly less than the desired half micron; whereas by comparison, inspection of 52d shows that the width of the undissolved resist is about only ⅛ micron. Thus, by this analysis, the disclosed method improves pattern fidelity by almost 100 percent.

Further, consider what happens to the resist patterns when the etching step lasts longer than the nominal 120 seconds. This, of course, is an important consideration since in any production process, the actual etching time will vary somewhat about a specified nominal time. Curves 42e and 52e show the shape of the resist for the desired half micron gap pattern after 150 seconds have expired. As therein illustrated, the actual width of the undissolved resist in the disclosed method is slightly more than ⅛ micron; whereas in FIG. 6c, the resist is completely dissolved. This, of course, would cause a catastrophic failure in the microelectronic circuit that is being fabricated.

Figure 7:
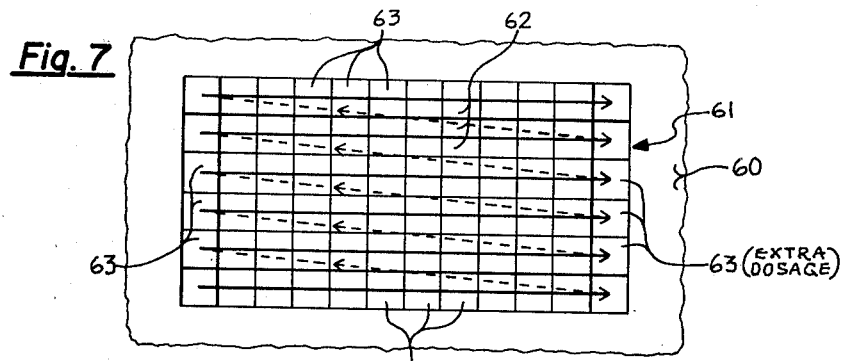
FIG. 7 illustrates a raster scanning sequence for carrying out the disclosed method.

Preferably, the above described method is implemented by serially bombarding the various resist patterns in a fly-back raster sequence as illustrated in FIG. 7. There, the resist layer is indicated by reference numeral 60; one of the portions which is to be bombarded thereon is indicated by reference numeral 61; and the fly-back raster path of the electron beam is indicated by reference numeral 62. Each of the square within portion 61 represents one of the positions of the electron beam as it is moved along path 62. In those squares 63 which form the perimeter of pattern 61, either the time duration of the electron beam or the intensity of the electron beam is increased to achieve the above described results. Preferably, this increase in time duration or intensity is at least ⅛ times larger than that used at the interior of the resist portion.

Figure 8:
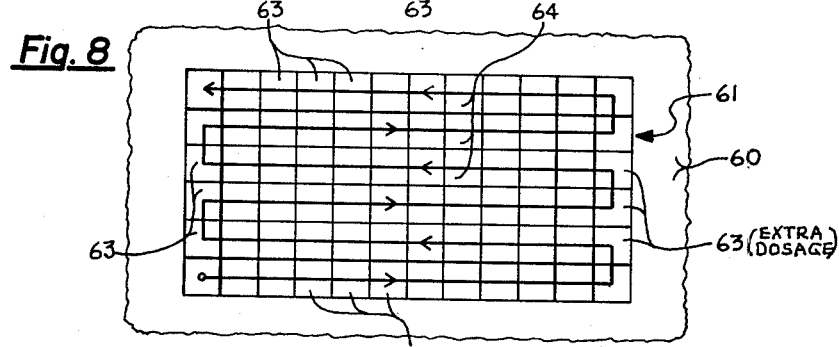
FIG. 8 illustrates a serpentine sequence for carrying out the disclosed method.

Alternatively, the disclosed method may be implemented by serially scanning each of the resist portions that are to be bombarded with an electron beam in a serpentine sequence. This is illustrated in FIG. 8. There, reference numeral 64 indicates the serpentine shaped path of the scanning electron beam; while reference numerals 60, 61 and 63 are as defined above. Again, the energy absorbed by the resist at the perimeter positions 63 of the path 64 may be raised to achieve the above results by either increasing the time duration or intensity of the electron beam at those positions.

Figure 9:
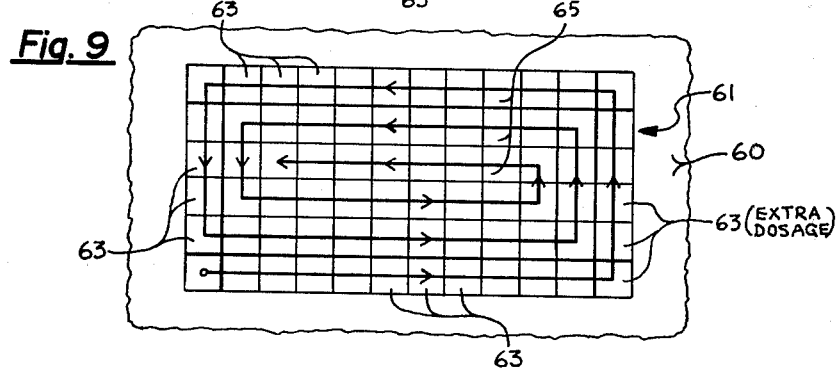
FIG. 9 illustrates a spiral sequence for carrying out the disclosed method.

As another alternative, the disclosed method may be implemented by serially scanning each of the resist portions with an electron beam in a spiral shaped path. Such a path is illustrated by reference numeral 65 in FIG. 9. Using this technique, either the time duration or intensity of the electron beam is increase for all of the positions of the beam during its first 360° of rotation.

Figure 10:
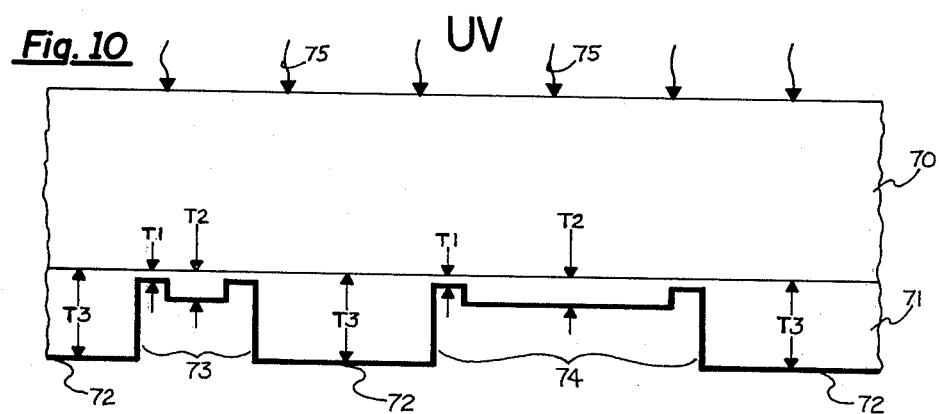
FIG. 10 illustrates a mask that may be utilized to carry out the disclosed method by bombarding all of the various shapes of the resist pattern simultaneously.

Still another technique for carrying out the disclosed method is illustrated in FIG. 10. In this technique, the various portions of the resist that are to be patterned are not scanned serially; but instead, they are all bombarded simultaneously. This is achieved by utilizing the FIG. 10 mask which includes a substrate 70, an opague material 71, and a photoemissive film 72. Both the substrate 70 and the film 72 are of essentially uniform thickness; whereas the opague material 71 has a thickness which is representative of those portions of the resist layer which are to be bombarded with electrons. Two such portions are indicated in FIG. 10 by reference numerals 73 and 74. They are characterized by a thickness T1 at their perimeter which is less than the thickness T2 a their interior portion. Also, the thickness T2 is substantially less than the thickness T3 of the material 71 which separates the portions 73 and 74.

In operation, the backside surface of substrate 70 is exposed to ultraviolet light 75. This light passes through the substrate, which provides a rigid support for the opague material 71 and the film 72. This light is completely absorbed by the material 71 in those regions where it is of thickness T3. Thus, no electrons are emitted by those corresponding portions of film 72.

By comparison, only a fraction of the ultraviolet light is absorbed by the opague material 71 in the regions where its thickness is either T1 or T2. And since the amount of light absorbed by the opague material is a function of the thickness of that material, then the number of photons which reach film 72 in the regions 73 and 74 will be greater at the perimeter than at the interior. Accordingly, the number of electrons which are emitted at the perimeter of regions 73 and 74 will be greater than the number of electrons at the interior. Those electrons may then be accelerated and focused by conventional electronics onto the layer of resist which is to be patterned.

Various preferred steps for carrying out the disclosed method have now been described in detail. In addition, many changes and modifications may be made to these details without departing from the nature and spirit of the invention. For example, utilizing the serial scanning sequences of FIGS. 7, 8, and 9, the intensity and time duration of the electron beam at each of the beam positions may be held uniform throughout the scanning process; and subsequently, a separate additional scan with the electron beam of only each portion's perimeter may be superimposed thereon. Therefore, since many modifications are possible, it is to be understood that the invention is not limited to said details but as defined by the appended claims.

What is claimed is:

1. In the process of constructing microelectronic circuits on a substrate, a method of fabricating high resolution resist patterns including the steps of:
   disposing a layer of electron sensitive resist over a surface of said substrate; and
   bombarding predetermined portions of said resist layer with electrons; said bombarding being performed in combinations of intensity and time duration which are different at the perimeter of said portions than at the interior thereof such that the energy absorbed by the resist at the perimeter of said portions is substantially greater than the energy absorbed at the interior of said portions.

2. A method according to claim 1, wherein said bombarding step is achieved by:
   serially scanning said predetermined portions of said resist with an electron beam of essentially constant intensity; and
   exposing the perimeter of said predetermined portions to said electron beam for a substantially greater time duration than the interior of said portions.

3. A method according to claim 2, wherein said serial scanning is performed in a fly-back raster sequence.

4. A method according to claim 2, wherein said serial scanning is performed in a serpentine sequence.

5. A method according to claim 2, wherein said serial scanning is performed in a spiral sequence.

6. A method according to claim 2, wherein said serial scanning includes a sequence where only the perimeter of said predetermined patterns are exposed to said electron beam.

7. A method according to claim 1, wherein said bombarding step is achieved by:
   serially scanning said predetermined portions of said resist with an electron beam of selectable intensity; and
   exposing the perimeter of said predetermined portions with an electron beam intensity that is substantially greater than the electron beam intensity at the interior of said portions.

8. A method according to claim 7, wherein said serial scanning is performed in a fly-back raster sequence.

9. A method according to claim 7, wherein said serial scanning is performed in a serpentine sequence.

10. A method according to claim 7, wherein said serial scanning is performed in a spiral sequence.

11. A method according to claim 7, wherein said serial scanning includes a sequence where only the perimeter of said predetermined patterns are exposed to said electron beam.

12. A method according to claim 1, wherein said bombarding step is achieved by:
    simultaneously exposing all of said predetermined portions of said resist to said electrons through a mask;
    said mask being patterned to cause the perimeter of said portions to be exposed to a substantially higher density of electrons than the interior of said portions.

13. A method according to claim 12, wherein said mask includes a layer of photo-emissive material overlying a layer of opague material, with said layer of opague material being substantially thinner under those regions of said emissive material that emit electrons directly to the perimeter of said portions than under those regions that emit electrons directly to the interior of said portions.

14. A method according to claim 12, wherein said photo-emissive material includes cesium iodide, palladium and said opague material includes chromium, silicon, titanium dioxide.

15. A method according to claim 1, wherein said energy absorbed at the perimeter of said resist portions is at least ⅛ times larger than the energy absorbed at the interior thereof.

16. A method according to claim 1, wherein said resist is a positive electron-sensitive resist.

17. A method according to claim 1, wherein said resist is a negative electron-sensitive resist.

* * * * *